United States Patent [19]

Huseby

[11] 4,162,918

[45] Jul. 31, 1979

[54] RARE EARTH METAL DOPED DIRECTIONALLY SOLIDIFIED EUTECTIC ALLOY AND SUPERALLOY MATERIALS

[75] Inventor: Irvin C. Huseby, Schenectady, N.Y.

[73] Assignee: General Electric Company, Schenectady, N.Y.

[21] Appl. No.: 847,779

[22] Filed: Nov. 2, 1977

[51] Int. Cl.$^2$ .................. B22D 21/06; C22C 19/00
[52] U.S. Cl. .......................................... 75/171; 75/170; 148/32.5; 164/72
[58] Field of Search .............. 75/170, 171; 148/32.5; 164/72

[56] References Cited

U.S. PATENT DOCUMENTS

| 3,799,769 | 3/1974 | Tarshis et al. | 75/171 |
| 3,846,159 | 11/1974 | Bornstein et al. | 117/71 M |
| 3,903,552 | 9/1975 | Kennedy | 75/122 |
| 3,904,402 | 9/1975 | Smashey | 75/170 |
| 3,976,516 | 8/1976 | Sahm | 148/32 |
| 4,003,765 | 1/1977 | Davidson | 75/171 |
| 4,019,900 | 4/1977 | Raghavan et al. | 75/171 |
| 4,031,945 | 6/1977 | Gigliotti, Jr. | 164/72 |
| 4,043,810 | 8/1977 | Acuncius et al. | 75/171 |
| 4,043,841 | 8/1977 | Bibring et al. | 148/32.5 |

FOREIGN PATENT DOCUMENTS

| 2418219 | 11/1974 | Fed. Rep. of Germany | 75/171 |
| 2427704 | 2/1975 | Fed. Rep. of Germany | 75/171 |
| 1397066 | 6/1975 | United Kingdom | 75/171 |

Primary Examiner—L. Dewayne Rutledge
Assistant Examiner—Upendra Roy
Attorney, Agent, or Firm—Donald M. Winegar; Joseph T. Cohen; Charles T. Watts

[57] ABSTRACT

Less than 3 weight percent of a rare earth metal is employed in doping a directionally solidified eutectic alloy or a superalloy material to minimize the formation of a metal-ceramic reaction layer during casting and solidification thereof.

4 Claims, 1 Drawing Figure

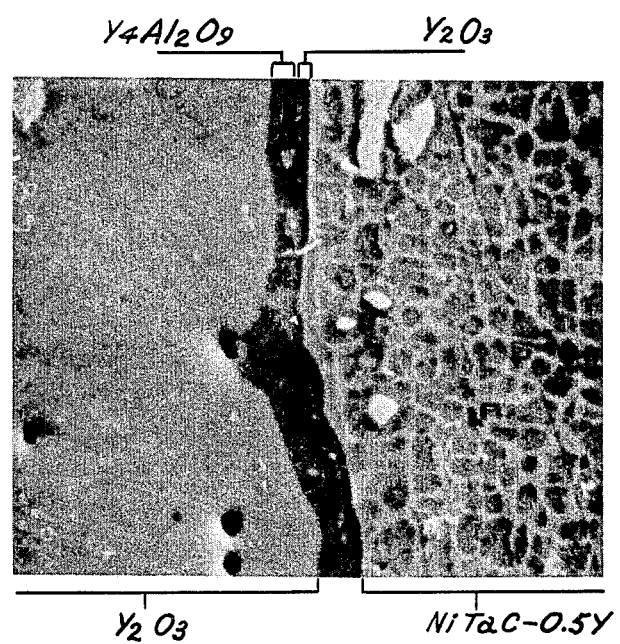

RARE EARTH METAL DOPED DIRECTIONALLY SOLIDIFIED EUTECTIC ALLOY AND SUPERALLOY MATERIALS

BACKGROUND OF THE INVENTION

1. Field of the Invention

This invention relates to the minimizing of metal-mold reactions between cast superalloy and directionally solidified eutectic materials and cores and/or molds employed therewith.

2. Description of the Prior Art

The production of directionally solidified (DS) metal eutectic alloys and superalloys for high pressure turbine (HPT) airfoils with intricate internal passageways for air cooling requires that the core and mold not only be dimensionally stable and sufficiently strong to contain and shape the casting but also be sufficiently crushable to prevent mechanical rupture (hot cracking) of the casting during solidification and cooling. The DS process requirements of up to 1875° C. for a 16 hr. time period imposes severe constraints on materials which may serve as mold or core candidates.

The prior art appears to be mostly limited to the use of silica or silica-zircon core and mold materials. At temperatures greater than 1600° C. the silica based materials fail from the standpoint of both mechanical integrity and chemical incompatibility with the advanced alloy compositions.

Dimensional control of the silica core is excellent since cristobalite exhibits very little densification. Microstructural examination reveals that, in some cases, commercial core compositions employ very large particles (>100 μm). The addition of large particles serves to lower both shrinkage and mechanical strength.

Paul S. Svec in "Process For Making an Investment Mold For Casting And Solidification of Superalloys Therein", Ser. No. 590,970, teaches the use of alumina-silica compositions for making molds and cores. Charles D. Greskovich and Michael F. X. Gigliotti, Jr. in U.S. Pat. Nos. 3,955,616 and 3,972,367 teach cores and molds of alumina-silica compositions which have a barrier layer of alumina formed at the mold/metal interface. One possible means for the formation of their alumina layer is by a chemical reaction wherein carbon of the susceptor chemically reduces the material composition of the mold or core. Charles D. Greskovich, Ser. No. 698,909, also teaches an alumina-silica composition wherein the material is of a predetermined size so as to favor, and therefore enable, the formation of metastable mullite for molds and cores which exhibit superior sag resistance at high temperatures.

Aluminum oxide ($Al_2O_3$) by itself, without a chemical or physical binder material, has been identified as a potential core and mold material based on both chemical compatibility and leachability considerations. Aluminum oxide, or alumina doped with rare earth oxides has also been proposed as suitable core and mold materials for casting and solidifying the same superalloy materials. Some oxide ceramics have a free energy of formation that is much more negative than that of $Al_2O_3$ and yet react with the aluminum of a superalloy material such as NiTaC-13 and the like. Such a reaction results in the formation of a mixed oxide layer at the metal-ceramic interface. In particular when $Y_2O_3$ is the ceramic material in contact with the molten metal NiTaC-13, the double oxides $Y_3Al_5O_{12}$, $YAlO_3$ and $Y_4Al_2O_9$ are formed at the metal-ceramic interface when $Y_2O_3$ reacts with molten metal. Such a reaction layer is undesirable for several reasons including:

1. Such a mixed oxide layer which forms during directional solidification has an irregular surface morphology. Removal of the mixed oxide layer results in a rough metal finish for the casting and loss of dimensional tolerances.
2. The reaction layer is usually very difficult to leach from the casting by the autoclave caustic leaching process.
3. The reaction layer does not appear to dissolve in mineral acids.

Therefore, it is an object of this invention to provide a new and improved superalloy material which exhibits a minimum reactivity with the ceramic material in contact therewith during casting.

Another object of this invention is to provide a new and improved superalloy material which is doped with less than 3 weight percent of a rare earth metal.

Other objects of this invention will, in part, be obvious and will, in part, appear hereinafter.

BRIEF DESCRIPTION OF THE INVENTION

In accordance with the teachings of this invention there is provided a new and improved superalloy material, including directionally solidifiable eutectic alloys. The superalloy casting material is doped with less than 3 weight percent of the same rare earth metal whose metal cation is in the ceramic material comprising the mold and/or core used in casting and directionally solidifying the cast material. The rare earth metal is selected from the group consisting of Y, Sm, Nd, Gd, Dy, Er and Yb.

Doping of the superalloy material minimizes, or substantially eliminates, the formation of a metal-ceramic reaction layer.

BRIEF DESCRIPTION OF THE FIGURE

The FIGURE is a scanning electron micrograph, at 5000×, of a section of NiTaC-13 - 0.5Y alloy cast in contact with $Y_2O_3$ ceramic material.

DESCRIPTION OF THE INVENTION

The addition of a small amount of a rare earth metal to a directionally solidifiable eutectic alloy or a superalloy material minimizes, or substantially prevents, the formation of a mixed oxide layer at the metal-ceramic interface during casting and solidification. The rare earth metal added to the alloy material composition is the same as the rare earth metal comprising the ceramic material for making the casting and/or core employed in casting and solidifying the alloy material.

For example, when NiTaC-13 is cast and directionally solidified about a core made of yttria ($Y_2O_3$) a layer of double oxides of $Y_3Al_5O_{12}$, $YAlO_3$ and $Y_4Al_2O_9$ is formed at the metal-ceramic interface. Initially the chemical reaction occurring will have a negative free energy and continue to occur. However, with the increase of yttrium in solution in the NiTaC-13 melt the free energy becomes less negative, and the chemical reaction less likely to continue. Eventually the chemical reaction substantially ceases as enough yttrium has been dissolved and the chemical reaction reaches chemical equilibrium.

Therefore, a small amount of the rare earth metal comprising the ceramic of the core and/or mold is added to the eutectic alloy or superalloy material. An amount, preferably of the order of less than 3 weight percent, and preferably less than 1 weight percent, of the suitable rare earth metal, has been found sufficient to dope the eutectic alloy or superalloy material to substantially eliminate the reaction layer formed at the metal ceramic interface without deleteriously affecting the integrity of the cast metal. This enables the use of the following core and mold materials for directional solidification of superalloys such as NiTaC-13:

| Mold & Core Material | Dopant or Metal Addition |
|---|---|
| $Y_2O_3$ | Y |
| $Sm_2O_3$ | Sm |
| $Nd_2O_3$ | Nd |
| $Gd_2O_3$ | Gd |
| $Dy_2O_3$ | Dy |
| $Er_2O_3$ | Er |
| $Yb_2O_3$ | Yb |

In order to illustrate the teachings of this invention, several crucibles and rods of $Y_2O_3$ were manufactured. Each crucible was approximately 1 inch in diameter and approximately 3 inches in length. Each rod was approximately 3/16 inch in diameter and approximately 3 inches in length. Each of the crucibles and rods was made by isostatic compression at 30,000 psi followed by sintering for 1 hour at 1800° C. ±50° C.

EXAMPLE I

A eutectic alloy composition, NiTaC-13 was prepared to which 0.5 weight percent of yttrium was added. The nominal composition of NiTaC-13, in weight percent, as prepared was:

| Nickel | 63.4% | Rhenium | 6.2% |
|---|---|---|---|
| Chromium | 4.4% | Vanadium | 5.6% |
| Cobalt | 3.3% | Tantalum | 8.1% |
| Aluminum | 5.4% | Carbon | 0.48% |
| Tungsten | 3.1% | | |

The material composition was melted and cast in a copper mold.

One $Y_2O_3$ crucible was placed in a controlled atmosphere furnace. A $Y_2O_3$ rod was mounted vertically in the crucible and extended upwardly therefrom axially aligned with a hole in a second $Y_2O_3$ crucible mounted directly over the first crucible and rod to complete the assembly. The cast alloy of NiTaC-13 - 0.5% wt.% yttrium was placed in the upper crucible.

The assembly was heated in the controlled atmosphere furnace to 1800° C. ±20° C. and held at the elevated temperature for 20 hours. The atmosphere in the furnace was flowing argon gas passed through a gettering furnace to remove oxygen. During heating the cast metal alloy is melted and flowed through the hole in the second crucible into the bottom crucible and around the $Y_2O_3$ rod. After 20 hours, the furnace was cooled, the assembly removed from the furnace and sections orthogonal to the rod were prepared for examination by optical microscopy and electron microprobe analysis.

With reference to the FIGURE, optical microscopy examination reveals an irregular and discontinuous reaction layer approximately 1 micron in thickness formed within approximately 0.2 micron of the metal-ceramic interface. The material composition of the reaction layer was $Y_4Al_2O_9$ as determined by microprobe analysis. The reaction layer was separated from the metal by a layer of $Y_2O_3$ approximately 0.2 microns in thickness. Many portions of the metal-ceramic interface when examined did not contain a reaction layer. The surface of the casting was of commercial quality.

EXAMPLE II

As a control experiment and to verify prior findings, the experiment of Example I was repeated except that the material composition of NiTaC-13 was not doped with yttrium.

Optical examination of the sections clearly revealed a continuous metal-ceramic interfacial reaction layer approximately 30 microns in thickness. A microprobe analysis of the reaction layer identified the material as being comprised of $Y_3Al_5O_{12}$, $YAlO_3$ and $Y_4Al_2O_9$. The surface of the casting was not of the same quality as the casting surface in Example I.

As indicated from the results of Example I the addition of 0.5 wt.% yttrium to the NiTaC-13 alloy composition does have beneficial affects when the core and/or mold material is made of $Y_2O_3$ ceramic material. The addition of 0.5 weight percent yttrium reduced an ~30μ reaction layer, which was continuous, to a non-continuous reaction layer of approximately 1 micron thickness. Two of the three phases present in the continuous layer are not found in the discontinuous layer. The discontinuous layer is also probably easily removed from the metal-ceramic interface by an autoclave caustic leading process.

I claim as my invention:

1. A directionally solidifiable eutectic alloy casting material NiTaC-13 having a high resistance to metal-mold interface reaction during casting including less than 3 weight percent of a rare earth metal as a dopant material in its material composition, the rare earth metal is one whose metal cation is in the ceramic material comprising the mold and/or core in contact therewith.

2. The casting material of claim 1 wherein the rare earth metal is one selected from the group consisting of Y, Sm, Nd, Gd, Dy, Er and Yb.

3. The casting material of claim 1 wherein less than 1 weight percent of the rare earth metal is present in the material composition as a dopant material.

4. The casting material of claim 3 wherein the rare earth metal is one selected from the group consisting of Y, Sm, Nd, Gd, Dy, Er and Yb.

* * * * *